United States Patent
Martineau

(10) Patent No.: US 6,955,449 B2
(45) Date of Patent: Oct. 18, 2005

(54) LED SYMBOL SIGNAL

(75) Inventor: Patrick Martineau, Montreal (CA)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/388,123

(22) Filed: Mar. 13, 2003

(65) Prior Publication Data

US 2003/0174501 A1 Sep. 18, 2003

Related U.S. Application Data

(63) Continuation-in-part of application No. 10/122,576, filed on Apr. 15, 2002.
(60) Provisional application No. 60/361,140, filed on Mar. 1, 2002, and provisional application No. 60/283,882, filed on Apr. 13, 2001.

(51) Int. Cl.[7] .............................. F21V 13/04; F21V 5/00
(52) U.S. Cl. ...................... 362/246; 362/247; 362/244; 362/308
(58) Field of Search ................................. 362/246, 247, 362/240, 244, 248, 812, 800, 331, 333, 326, 308, 355, 498, 540, 545, 544, 543

(56) References Cited

U.S. PATENT DOCUMENTS

| | | | | |
|---|---|---|---|---|
| 1,566,621 A | * | 12/1925 | Senechal | 362/240 |
| 3,678,458 A | | 7/1972 | Ljungkull | 40/453 |
| 4,271,408 A | * | 6/1981 | Teshima et al. | 362/240 |
| 5,580,156 A | * | 12/1996 | Suzuki et al. | 362/184 |
| 5,687,500 A | | 11/1997 | Lamparter | 40/572 |
| 6,152,590 A | * | 11/2000 | Furst et al. | 362/545 |
| 6,509,840 B2 | * | 1/2003 | Martineau | 340/815.45 |
| 6,533,444 B2 | * | 3/2003 | Lee | 362/540 |

\* cited by examiner

Primary Examiner—Thomas M. Sember
Assistant Examiner—B Q T

(57) ABSTRACT

A LED symbol signal with LEDs arrayed to correspond to a desired symbol. A mask defines the desired symbol. A diffusion surface on the cover diffuses the display aspect, obscuring the individual LEDs. The mask is spaced a distance from the diffusing surface. The more aggressive the diffusion pattern the closer the mask is spaced to the diffusion pattern. Preferably, the ratio of the pitch of the optical elements to the width of the symbol at the diffusion surface is less than 1:2, preferably less than 1:4, more preferably less than 1:6 and most preferably approximately 1:10.

8 Claims, 18 Drawing Sheets

LED SYMBOL SIGNAL

This application is a continuation in part of U.S. application Ser. No. 10/122,576 filed on Apr. 15, 2002 that claims the benefit of U.S. provisional application 60/283,882, filed Apr. 13, 2001 and U.S. provisional application 60/361,140, filed Mar. 1, 2002, both applications hereby incorporated by reference in their entirety.

BACKGROUND OF THE INVENTION

1. Field of the Invention

The present invention relates to light emitting diode (LED) signals, specifically to an LED symbol signal with a uniform display aspect despite having a reduced number of LEDs.

2. Description of Related Art

Symbol signals, for example turn signals, pedestrian signals, and walk/don't walk signals previously have been designed with incandescent point light sources in a housing with a mask covering. The mask defining the symbol desired. Incandescent bulbs suffer from drawbacks of high power consumption and the requirement for frequent maintenance as the bulbs burn out.

LED symbol signals have reduced maintenance and operating costs due to the extreme life span of LEDs and their low power consumption in comparison to incandescent bulbs. Previously, LEDs were used to form the symbol desired by filling the symbol space with a full matrix of LEDs. As new, improved generations of LEDs become available, they emit more light from each individual LED. Therefore, the full matrix of LEDs is not required to create a suitably bright signal. The LEDs may then be spaced further apart from each other, omitting LEDs thereby saving material costs and lowering the signals operating power consumption. However, as the LEDs spacing increases, an undesirably "pixel effect" appears in which the individual LEDs become increasingly discernable to the viewer.

An object of the present invention is to provide a high efficiency and cost effective LED symbol with a reduced or eliminated "pixel effect". A further object of this invention is to provide a LED symbol signal with a design that may be easily modified as new generations of LEDs with increased light output become available, reducing the number of LEDs required to achieve a similar light output level.

An object of the present invention is to provide a high efficiency cost effective LED symbol with reduced sun phantom effect.

SUMMARY OF THE INVENTION

A LED symbol signal with LEDs arrayed to correspond to a desired symbol. Light from the LEDs is directed onto corresponding optical segments of a multiple collimating zone element and directed into a forward direction/distribution. A mask defines the desired symbol. The optical segments and or a diffusion surface on the cover or multiple collimating zone element(s) diffuses the display aspect, obscuring the individual LEDs. A diameter of the optical features of the diffusion surface is smaller than a diameter of the optical segments. The LED symbol signal may be configured for retrofitting into an incandescent lamp signal housing.

KEY TO FIGURE ELEMENTS

1—Cover
2—Mask
3—MCZE
4—Housing
5—PCB
6—Nut
7—Lock washer
8—LED(S)
9—Electrical components
10—Power connection
11—Post
12—PCB screw
13—Power supply wires
14—Screw
15—Electrical connection cover
16—Electrical connection screw 17—Incandescent socket power connector
18—Optical segment
19—Diffusion pattern
20—LED light emission pattern
21—O-ring
22—Bulk PCB panel
23—Reflector
24—Diffusion surface
25—Optical element

DETAILED DESCRIPTION

LED signals are disclosed in detail in U.S. patent application Ser. No. 09/756,670, now U.S. Pat. No. 6,509,840, filed Jan. 9, 2001 and further in U.S. patent application Ser. No. 09/827,429, filed Apr. 6, 2001, both applications assigned to Applicant, GELcore LLC, and hereby incorporated by reference in their entirety.

Figure 1A:
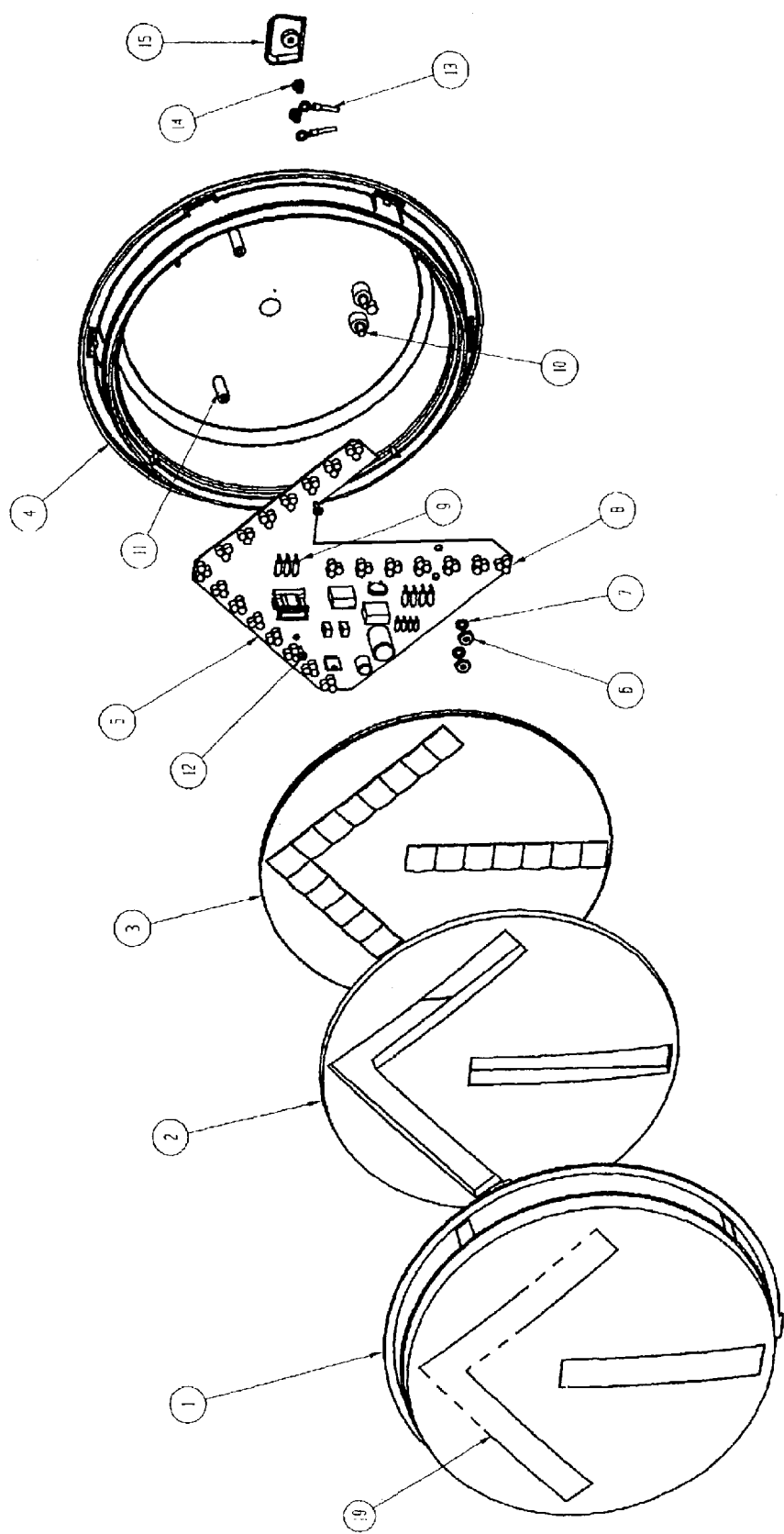
FIG. 1A is an isometric exploded view of a thick mask embodiment of the invention.
Figure 7:
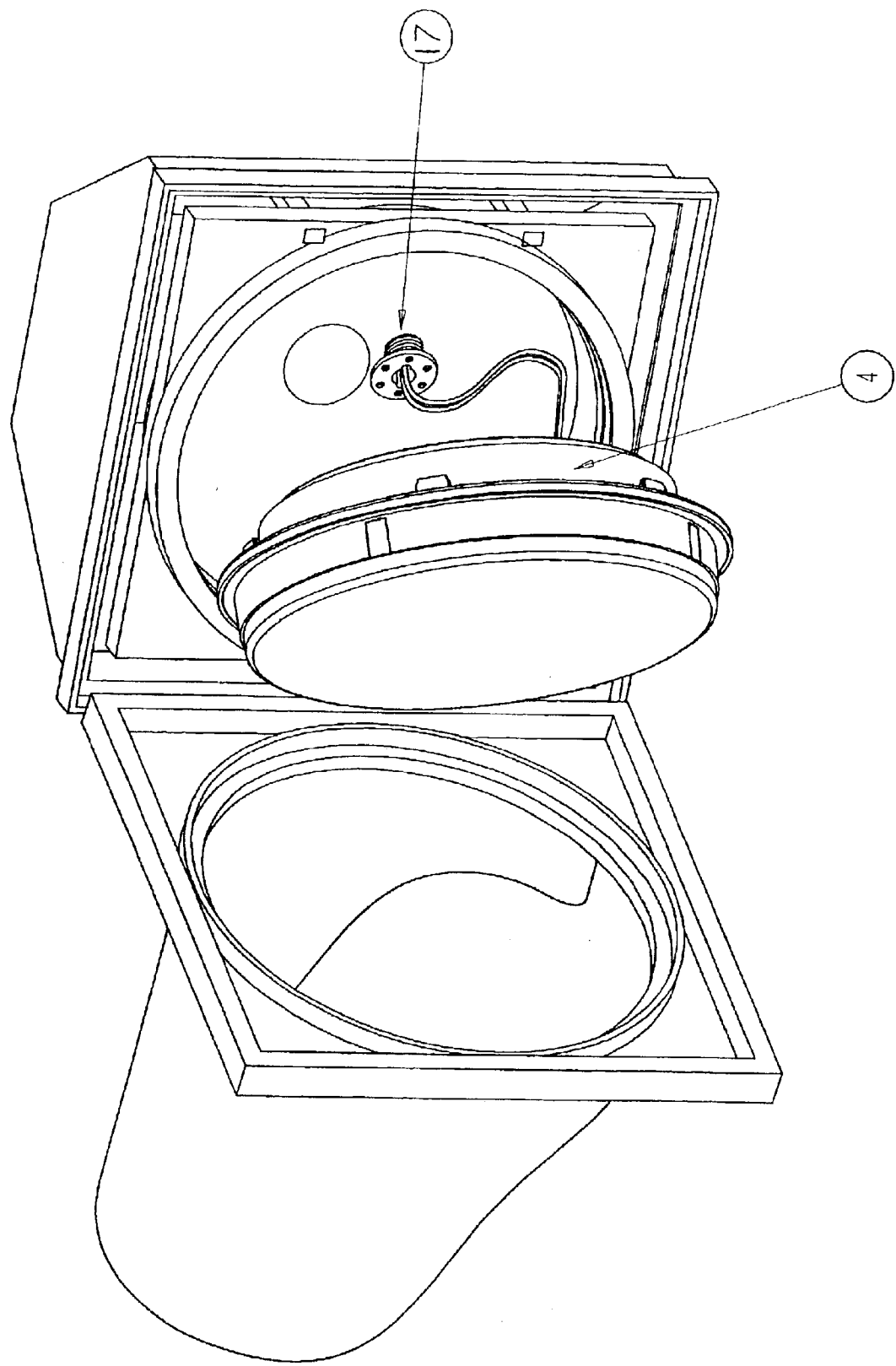
FIG. 7 is a perspective view of the invention inserted in an incandescent signal with the incandescent bulb and lens removed.

One embodiment of the present invention is shown in FIG. 1A. A printed circuit board (PCB) 5 includes power supply circuitry and LEDs 8 grouped in clusters of at least one LED 8 each, arranged in the form of a desired symbol, here a directional arrow. The PCB 5 is mounted in a housing 4 with integral power connection 10. As shown in FIG. 7, the housing 4 may be dimensioned to permit retrofitting of the invention into existing incandescent light signal housings upon removal of the original incandescent light bulb and lens(es). Power connection to existing signal housing may be via an incandescent socket power connector 17. Use of the socket power connector 17 removes the need for electricians to be involved in signal retrofitting activities. Mounted in/on the housing 4 spaced away from the PCB 5 is an optical element in the form of a multiple collimated zone element (MCZE) 3. Portions of the MCZE 3, not desired as part of the symbol are covered by a mask 2. The housing is closed by a cover 1.

Figure 2A:
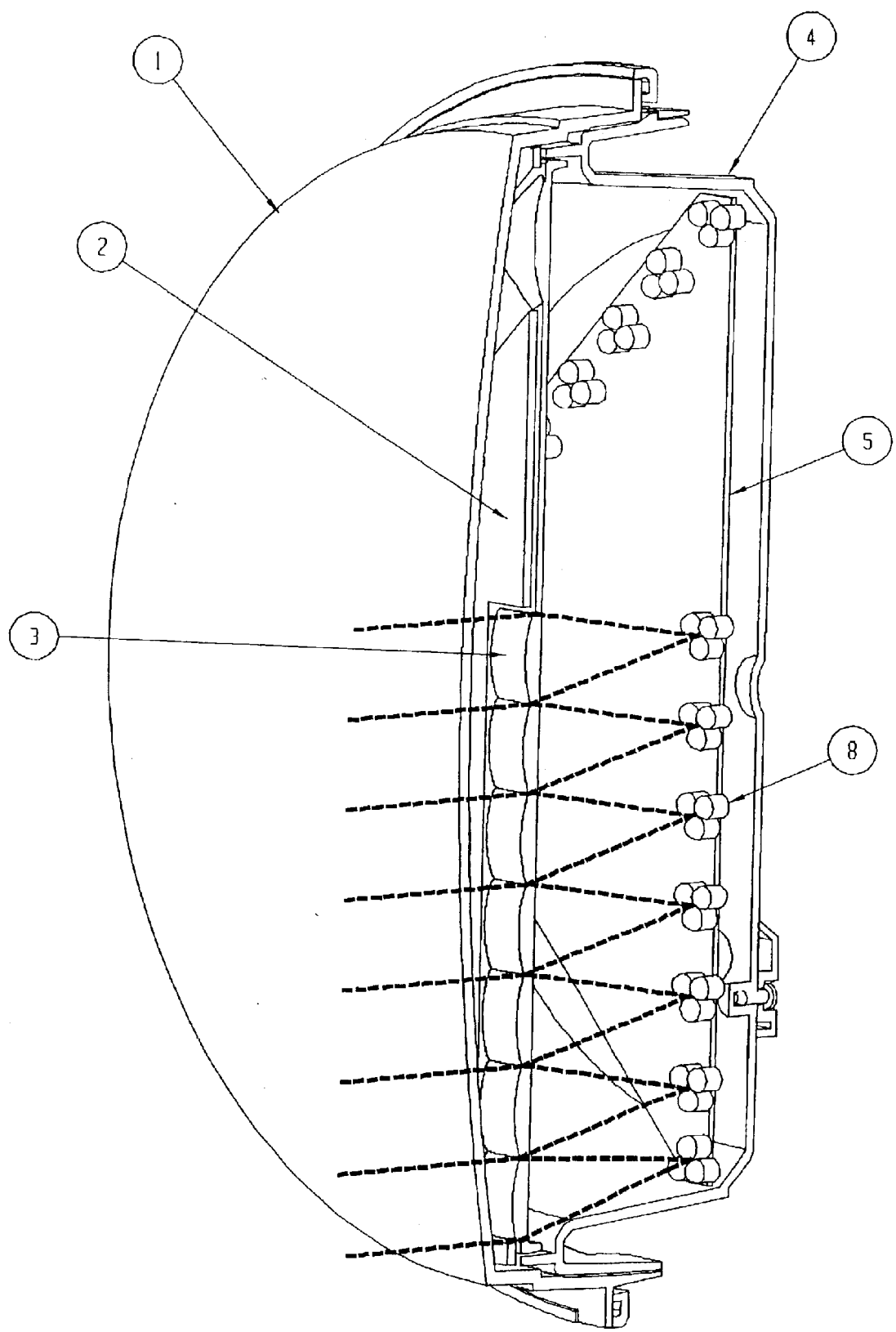
FIG. 2A is an isometric cut-away side view of a thin mask embodiment of the invention, showing light paths through the optical elements (electrical components omitted for clarity).
Figure 4A:
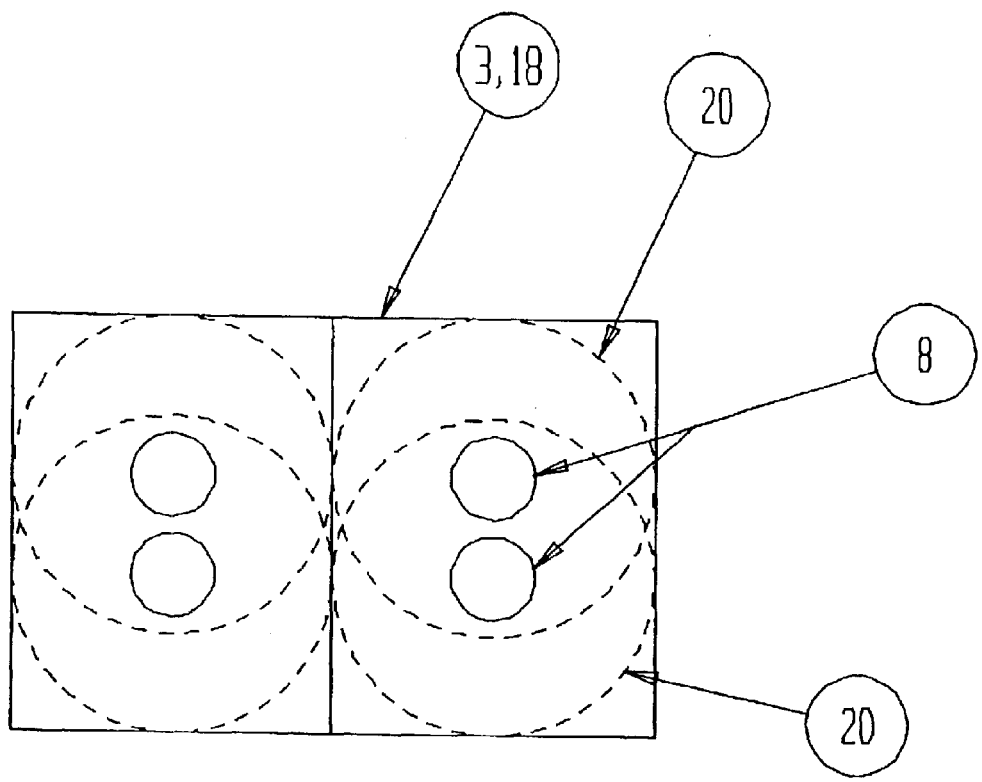
FIG. 4A is a schematic view of optical segments showing LED light distribution falling within the associated optical segments.
Figure 4B:
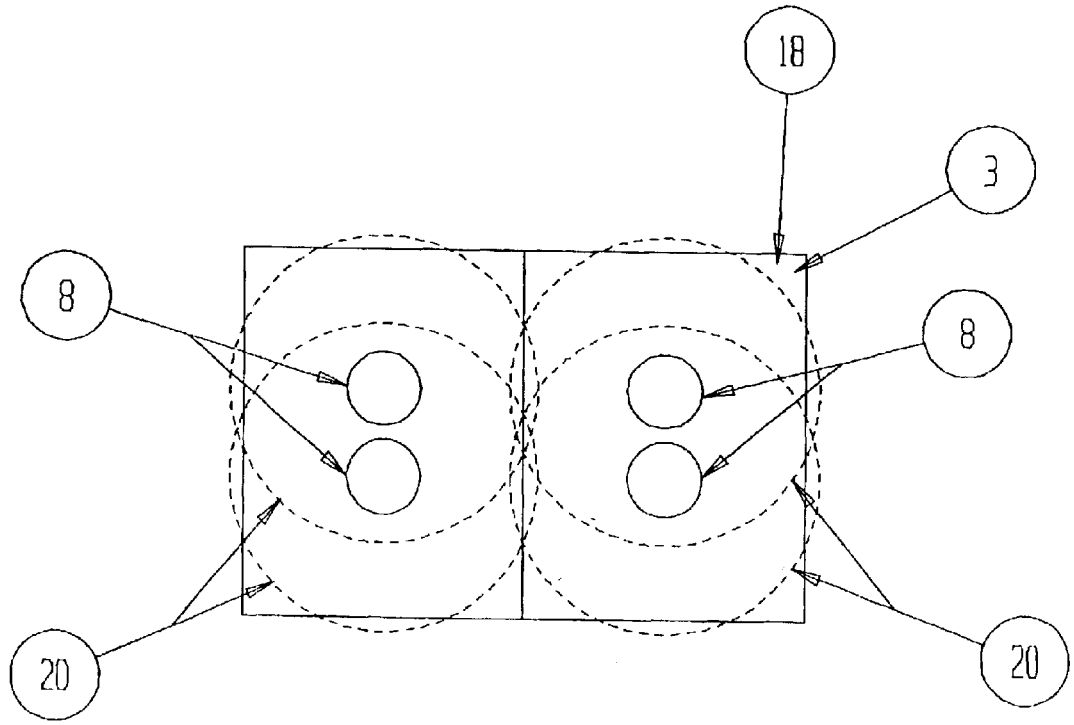
FIG. 4B is a schematic view of optical segments showing LED light distribution falling outside the associated optical segments.
Figure 5A:
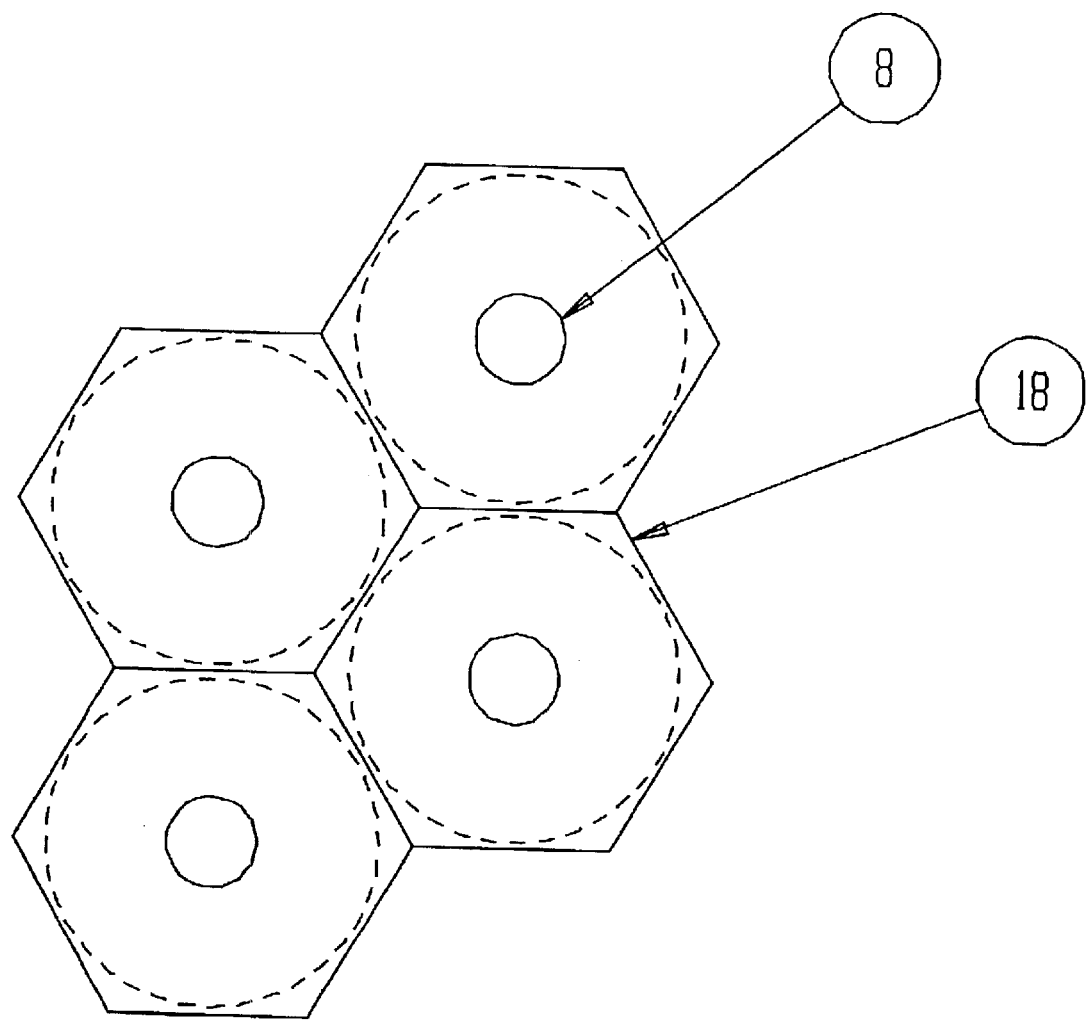
FIG. 5A is a schematic view of hexagonal optical segments.
Figure 5B:
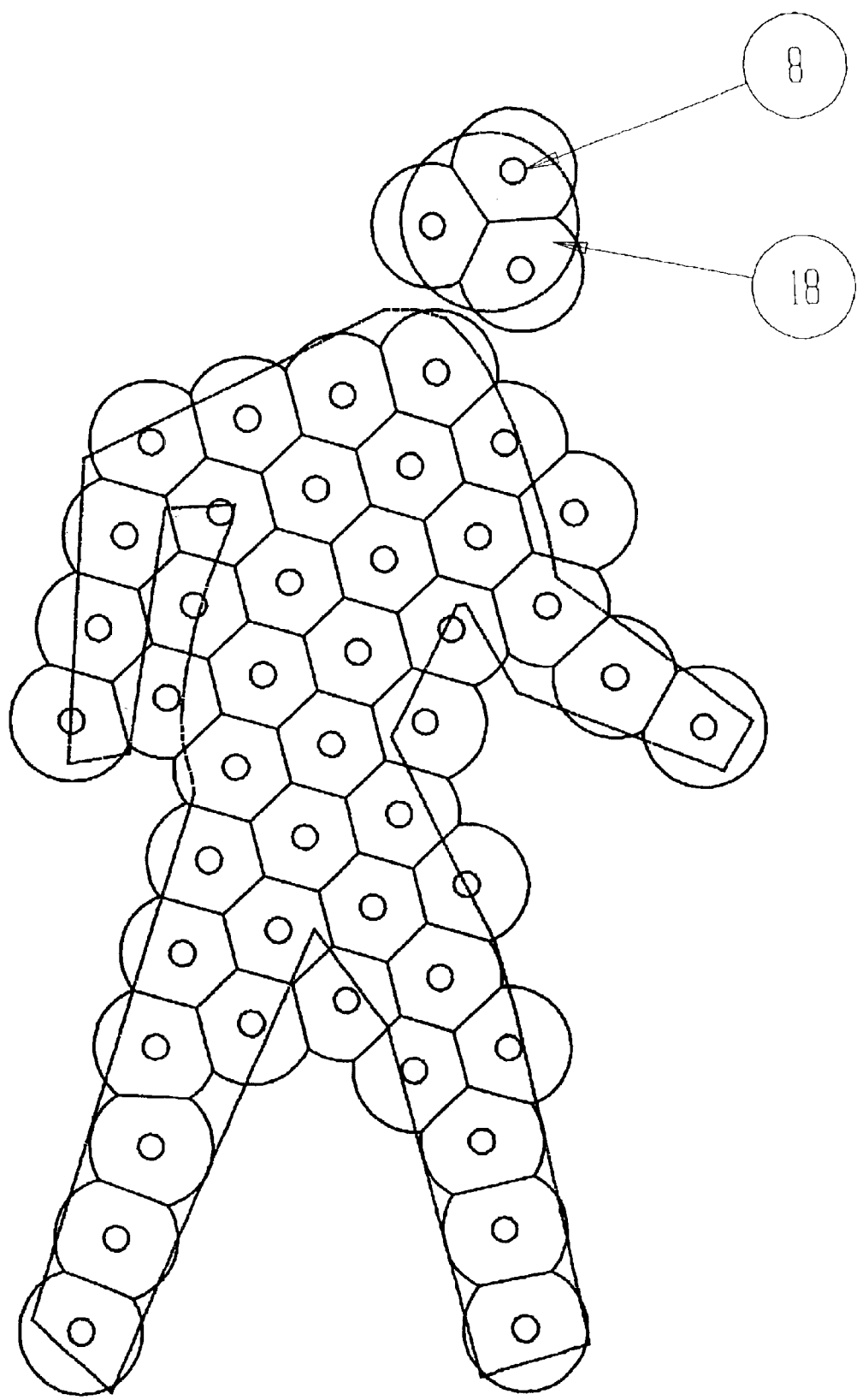
FIG. 5B is a schematic view of a human figure composed of hexagonal optical segments.
Figure 8:
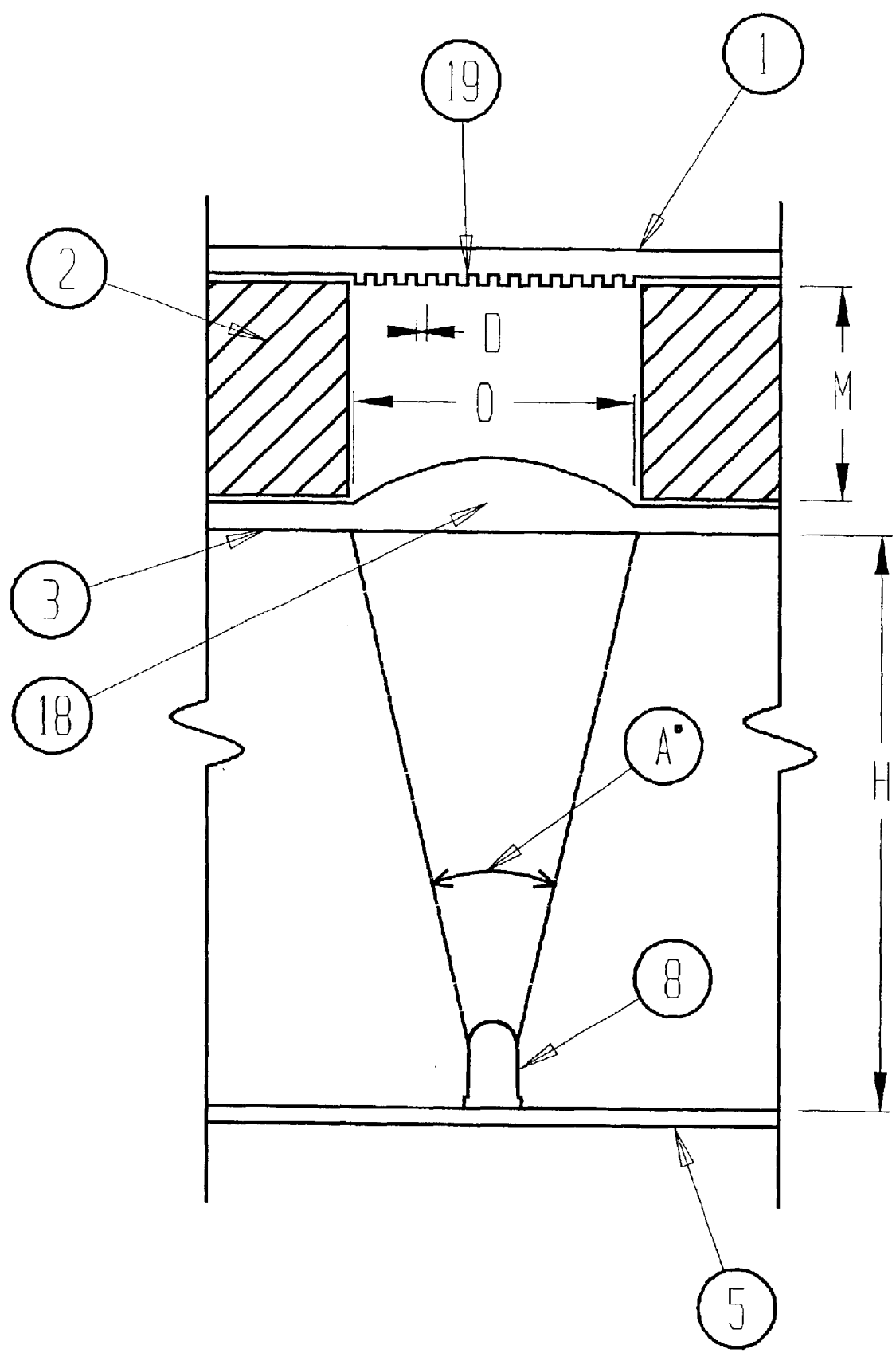
FIG. 8 is a partial side view of one embodiment of the invention showing the dimensional relationships of the invention elements.

MCZE 3 has optical segments 18 (collimating zones) matching the distribution of the LED 8 and/or LED 8 clusters on the PCB 5. As shown in FIG. 2A, each optical segment 18 collimates the light emitted from its respective LED 8 or LED 8 cluster. Also, each optical segment 18 may spread the light output into a desired distribution pattern. The effect of the MCZE 3 being to collect light from multiple point sources, each LED 8 cluster, and distribute it evenly so that the pixel effect of the individual LEDs 8 is minimized or removed from the display aspect observed by a view. As shown in FIG. 4A, it is preferred that rather than overlapping with a neighboring segment as shown in FIG. 4B, that the light patter 20 from each LED/LED cluster fall within a single optical segment 18. As shown in FIG. 8, tuning of the Led light emission pattern 20 to fall within an optical segment 18 diameter 0 and the distance H between the PCB 5 and the MCZE 3. For large symbol areas, for example in a walk/don't walk symbol, the MCZE 3 optical segments 18 may be formed in a hexagonal shape, as shown in FIGS. 5A and 5B. The hexagonal shape minimizing shadows or dark areas as it approximates the circular light emission pattern 20 of the LED(s) 8. Where the optical segments 18 are on an outside edge, rather than forming the outer edge in the hexagonal form, a circular outside edge maximizes coverage.

A diffusion pattern 19 on the inner or outer surface of the MCZE 3 or on an inner or outer surface of the cover 1 may be used to further obscure discernability of individual LEDs 8 in the display aspect. The diffusion pattern may be composed of circular, rectilinear or other geometric forms. Also, the diffusion pattern 19 may be formed on the desired surface via abrasion, impact and/or sandblasting. The diffusion pattern 19 preferably has individual diffusion element diameters D in a less than 1 to 1 ratio to the diameter O of the associated optical segments 18.

Cover 1 provides an environmental seal for the signal. A flat or a large radius outer surface on cover 1 prevents dirt build-up on the MCZE 3. Sealing means, for example on o-ring 21, between the cover 1 and housing 4 seals the signal from the environment.

Mask 2 may be integrated with the MCZE 3 and/or with the cover 1. The mask 2 may be in the form of a dark or opaque material, created via insert film molding, tape, paint coating or other means for blocking the Led 8 light not passing through the optical segments 18.

Figure 2B:
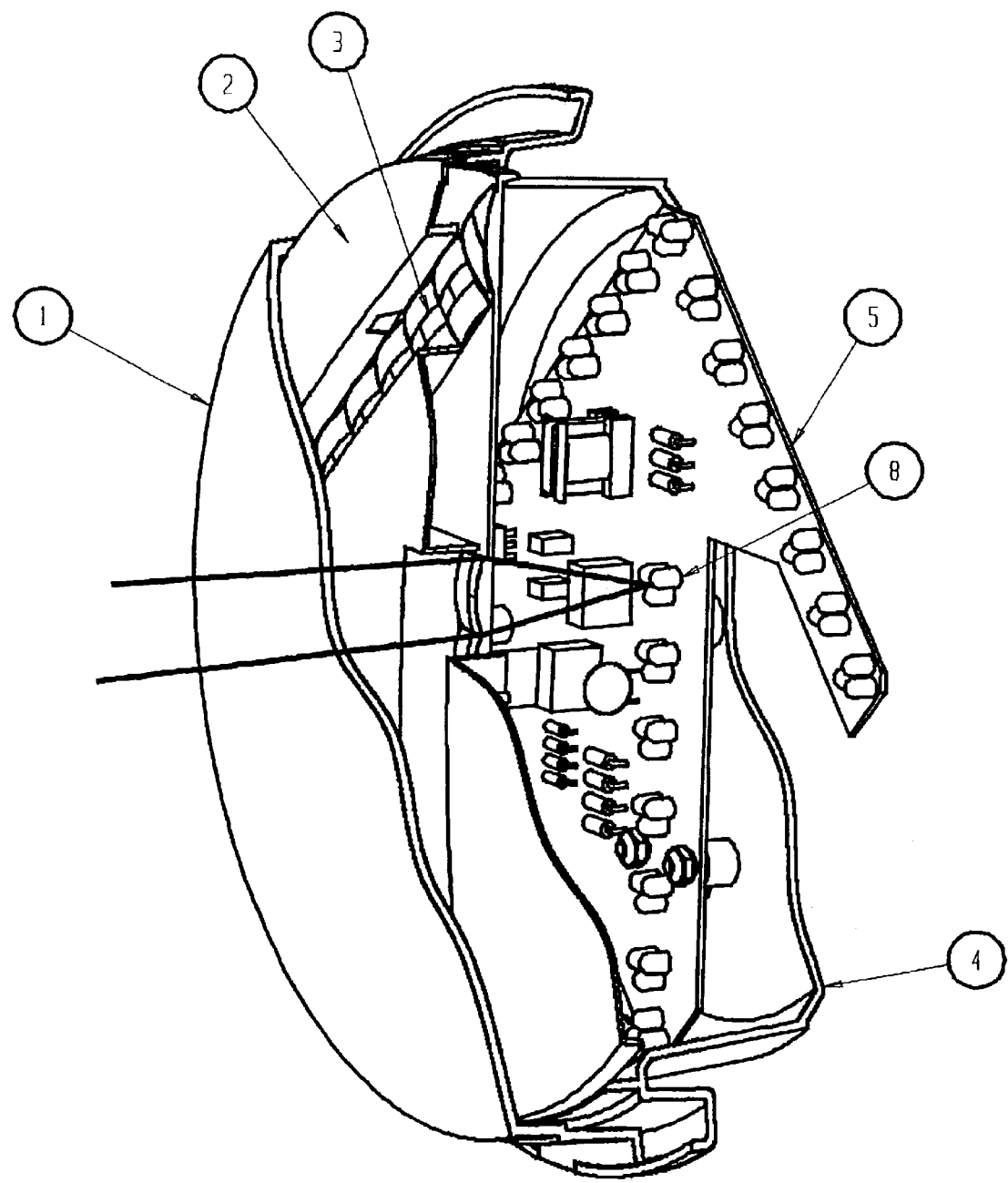
FIG. 2B is an isometric cut-away side view of a thick mask embodiment of the invention.
Figure 3A:
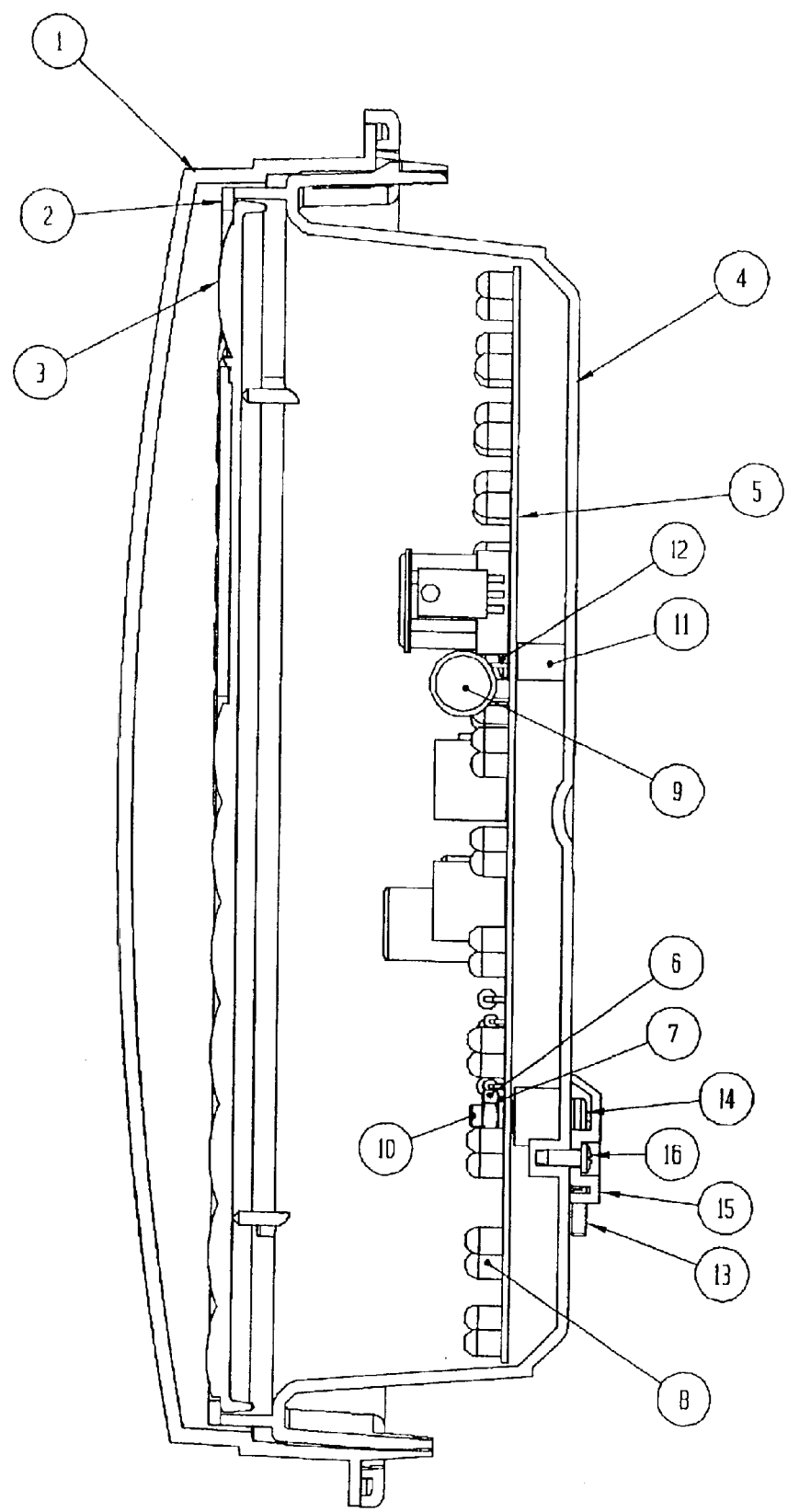
FIG. 3A is a side view of the embodiment shown in FIG. 2A, with increased component details.
Figure 3B:
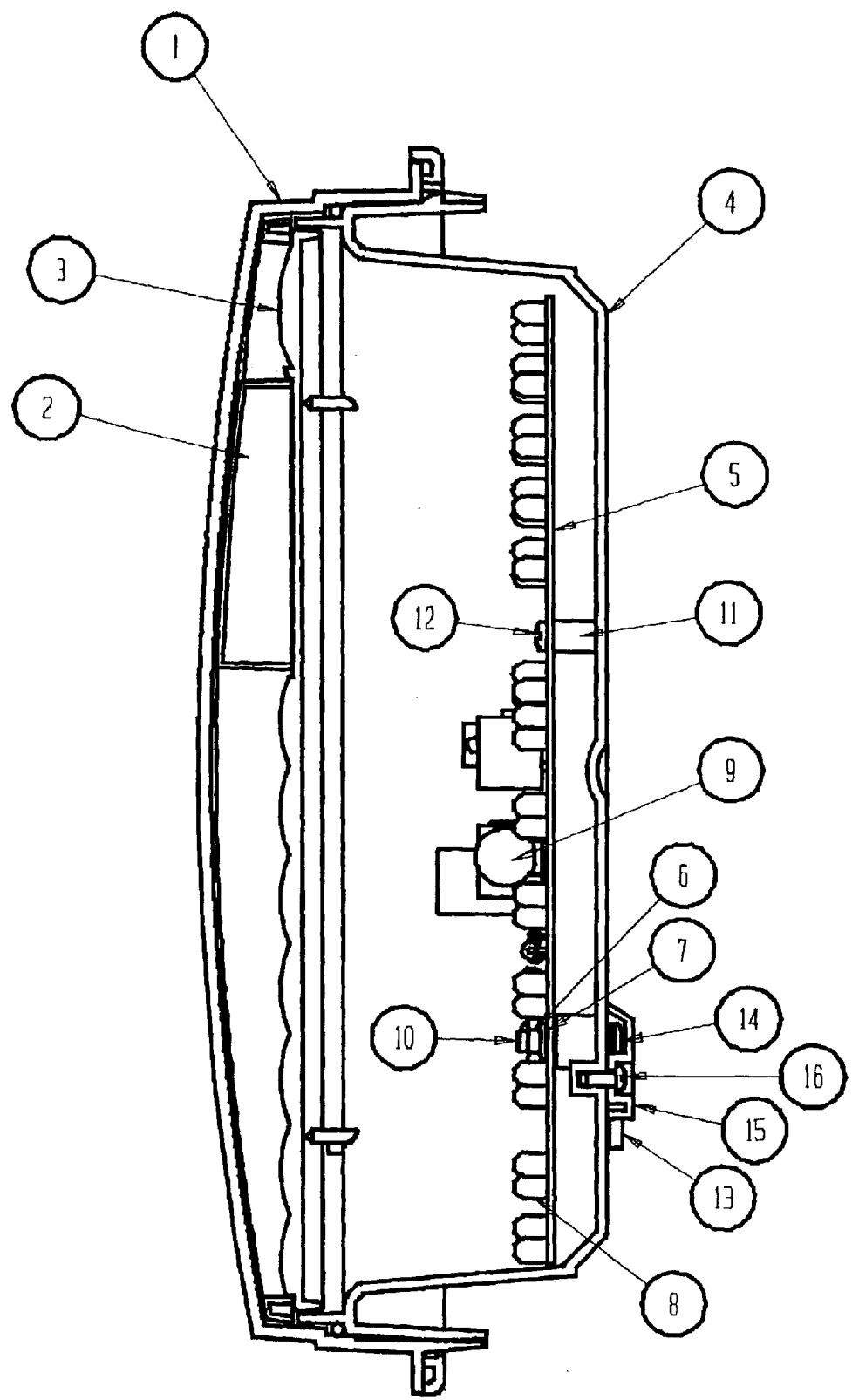
FIG. 3B is a side view of the embodiment shown in FIG. 2B, with increased component details.

To increase the symbol definition and minimize spurious light emissions, the mask 2 may be designed with a depth M that substantially fills the space between the MCZE 3 and the cover 1 (FIGS. 1A, 2B, 3B).

MCZE 3 may be a full disk or other shape dimensioned to cover the open end of the housing, with optical segments formed thereon or there may be discrete elements snap-fitting for example, into openings in the mask 2. For highest economy of materials, the cover 1, mask 2 and MCZE 3 may be integrated into a single component.

To combat sun phantom effect, the cover 1 may include an angled outer surface. Also, the diffusion patter may be limited to only those areas in alignment within apertures in the mask 2 which define the desired symbol.

In an alternative embodiment, the signal has a cover 1 with a plurality of optical elements 25 on at least one surface. There is no MCZE in this embodiment. In the preferred embodiment the optical elements are on the inside surface of the cover and the outside surface is substantially smooth. In the preferred embodiment the optical elements are a diffusion pattern that covers substantially the entire inside surface of the cover 1.

When sun hits the lens, it can reflect back and a viewer may see a signal as on even when it is off. This sun phantom effect is obvious for symbols such as arrows and pedestrian signals. The symbol appears lit even when it is off. Lensing can exacerbate the effect. The sun reflects off the lens and/or the cup of the LEDs. Further, if a diffusion pattern is limited to the areas in alignment with the symbol, reflection can also have the appearance of an on signal.

To reduce the sun phantom effect, a diffusing surface is coupled with a mask 2. The mask 2 is spaced a distance D1 from the diffusing surface 24. The mask 2 is spaced a distance D2 from the PCB 5 or the LED base. The mask has an opening of width D3. The symbol at the diffusion surface has a width D4 which is larger than D3. The light appears to be generated from the diffusing surface. For example, for a 12-inch signal, an arrow symbol having a width D4 of 1 inch the width D3 of the mask opening would be less than 1 inch.

The optical elements 25 that make up the diffusion pattern can be circular, rectilinear, or other geometric forms with spherical, arc, or straight-line faces being the preferred shapes. The optical elements 25 have a pitch P, which is the distance between 2 elements and a radius R.

The size of the optical elements effects the definition of the signal. The more aggressive the diffusing pattern, the closer the mask may be to the pattern to improve the signal definition. The smoother the diffusing surface, the further the mask should be placed from the diffusing surface. It is preferred that the ratio of the distance between optical elements and the signal width, P/D4 be a ratio of less than ½. More preferably less than ¼, ⅕ or ⅙. Most preferably, the ratio of P/D4 is approximately 1/10. For example, for a 12-inch signal with a 1-inch arrow the pitch is preferably approximately 0.1 inch. If the ratio becomes too small, other optical effects are seen.

Preferably narrow spread LEDs are used in this embodiment. More preferably LEDs which emit light in a 15 degree–20 degree spread are preferred. The light from the narrow spread LED is spread by the diffusion surface. Preferably, the light is spread to 30 degrees. The wider the spread of the LED the lower the light intensity. Choosing an LED with a narrow light pattern allows the signal to have the required on-axis intensity. Most of the light in narrow spread LED is directed within the mask opening.

In the present embodiment, the number of LEDs can be increased or decreased on an LED by LED basis. There is no need to reduce or increase the number LEDs in proportion to the number of clusters as there would be necessary if a MCZE 3 were used. The LEDs can be redistributed on the PCB or in the desired shape based on their light output as necessary or as desired.

Figure 12A:
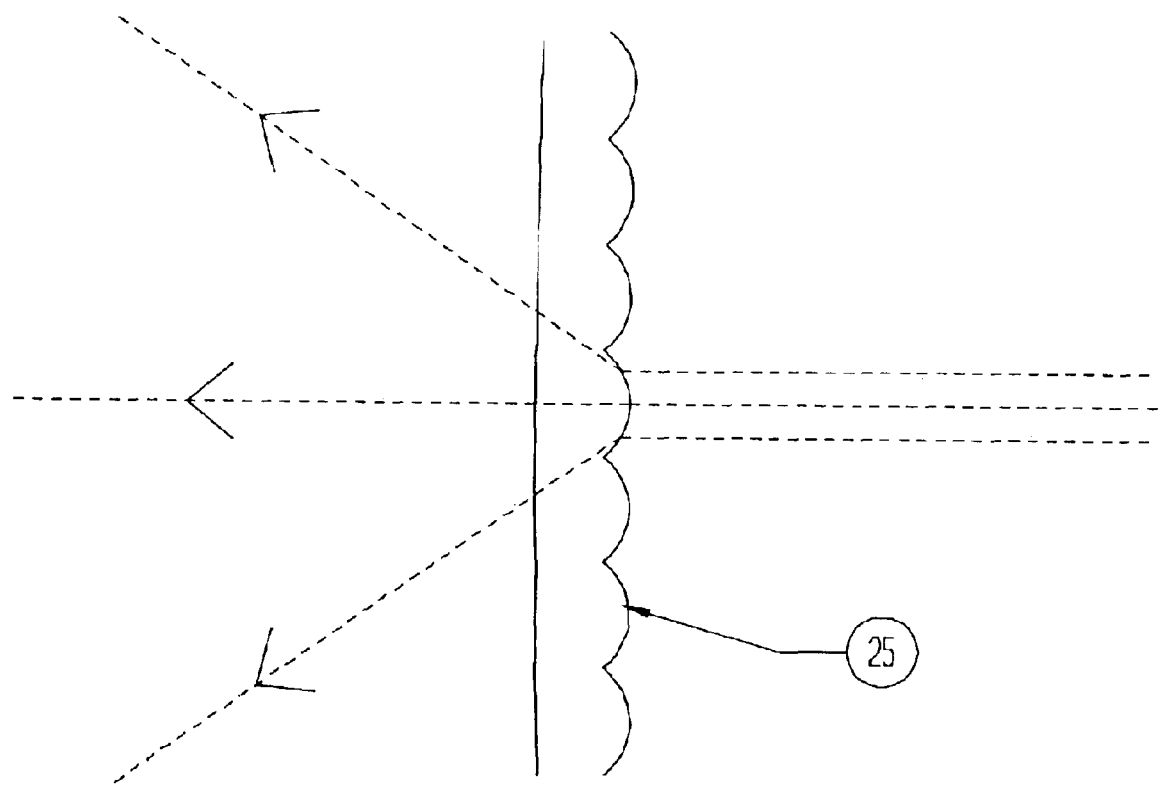
FIG. 12A is a cross section an alternative embodiment of a diffusion surface.

The optical elements 25 may be spherical as shown in FIG. 12A. The spherical optical elements direct the light in every direction. This symmetrical diffusing pattern is preferred for symbols such as arrows which may be used in any orientation, such as left arrow, right arrow, and straight-ahead arrow.

Figure 12B:
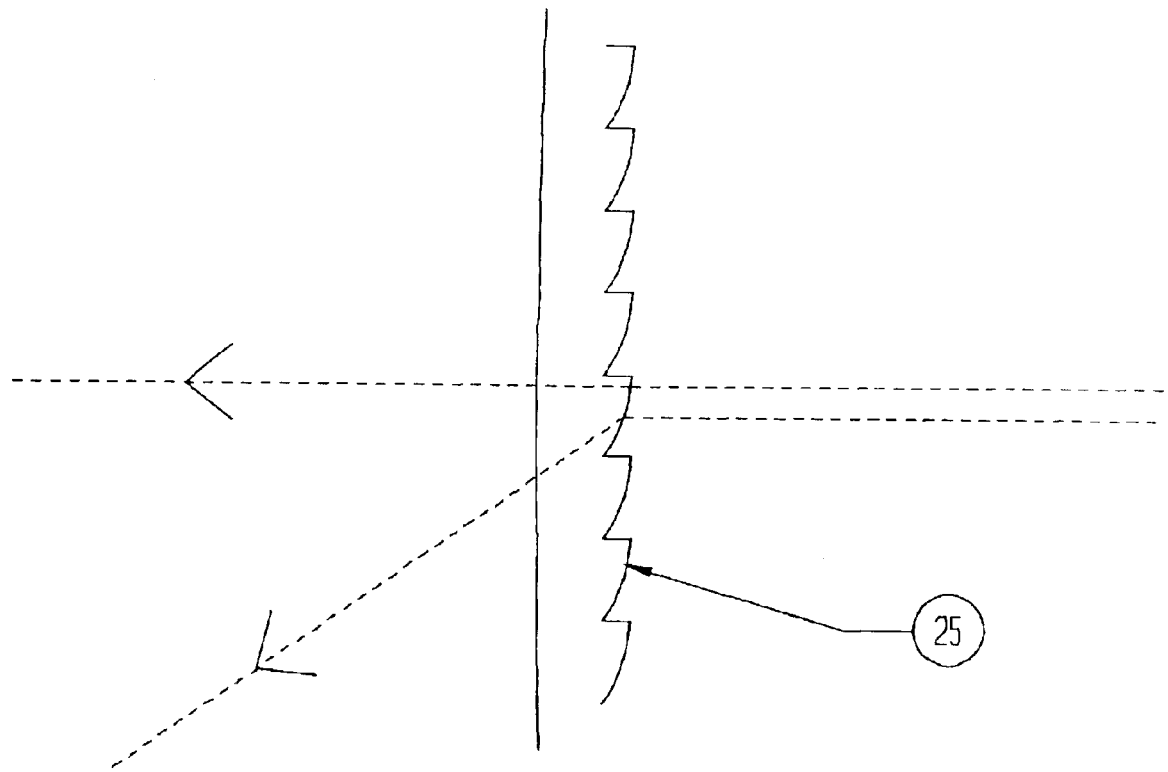
FIG. 12B is a cross section of a second alternative embodiment of a diffusion surface.

Alternatively, the optical elements 25 can be shaped to direct the light. As shown in FIG. 12B, the optical elements 25 can be arcs which redirect the light down. This embodiment would be preferred for a symbol which has a known orientation such as a pedestrian symbol. However, it could be used with any type of symbol. While FIG. 12B shown optical elements that redirect the light along the vertical axis, the optical elements could be oriented to direct the light in the horizontal direction or any desired direction as dictated by the application.

To allow directional signals to be used in any orientation, without requiring changes to the internal components, the light pattern generated by the optical elements 25 may be spherically symmetrical as seen in FIG. 12A allowing the assembled housing to be turned in any direction to orient, for example, a signal arrow as desired. A symmetrical optical design focusing the light output along the axis beam of the housing with minimal spreading allows the housing to be turned in any direction without losing the correct display aspect. An asymmetrical optical design as seen in FIG. 12B may be used to minimize sun phantom effect and/or meet industry specifications related to light distribution for the display aspect of traffic signals.

Figure 1B:
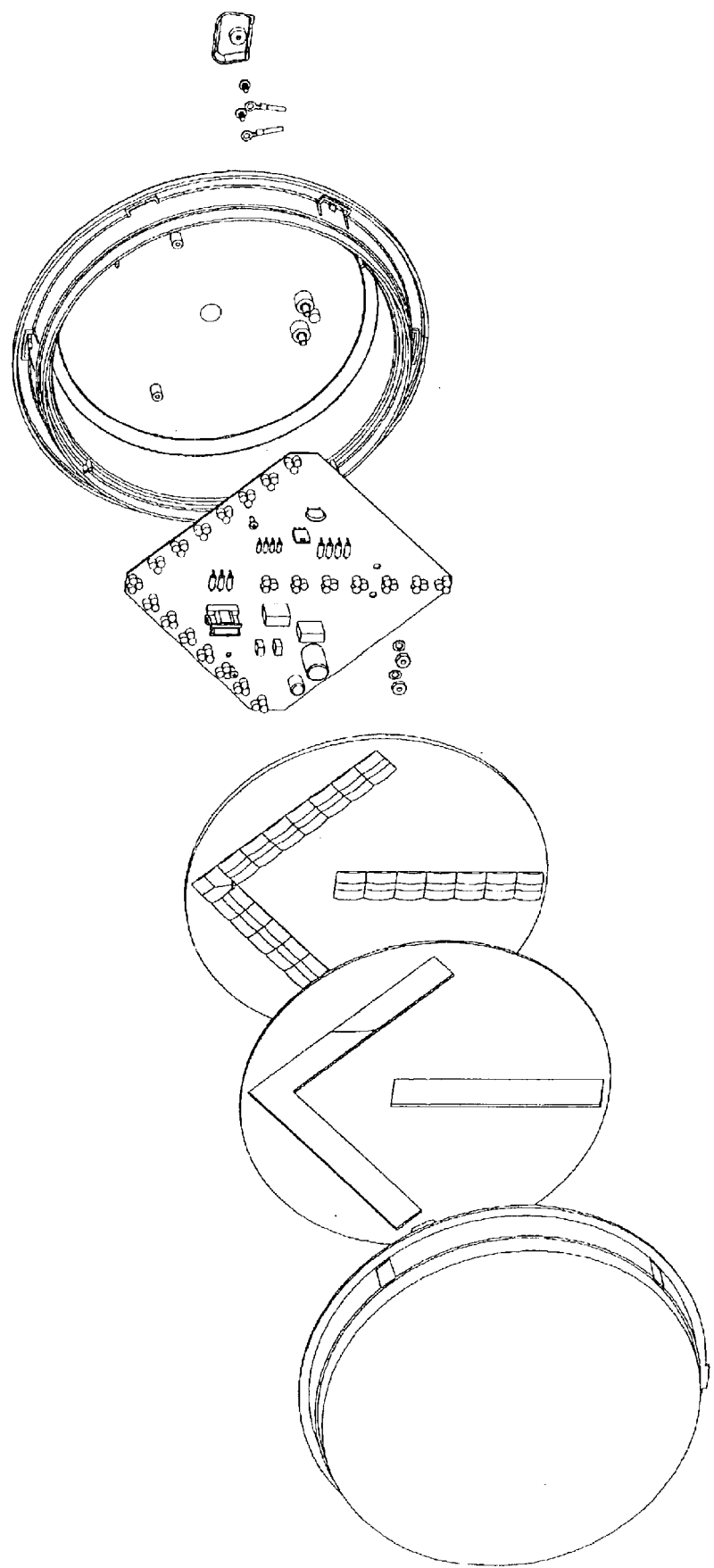
FIG. 1B is an isometric exploded view of a thin mask embodiment of the invention.

The distance H between the MCZE 3 and the PCB 5 is approximately 1 inches in a standard twelve-inch signal (FIG. 1). For designs where the symbol may be fully illuminated by a shorter distance between the LEDs 8 and MCZE 3, standoffs or shallower housings may be used. The proper distance allows the LEDs 8 to fully illuminate each optical segment 18 without creating overlap, noticeable shadows or dark areas. The resulting light beam from the signal may be changed by moving the PCB 5 with respect to existing optical components (changing H) thereby changing the light output distribution. This spacing also allows use of light degradation sensor circuitry as described in applicant's Ser. No. 09/827,429 application incorporated herein.

Figure 9:
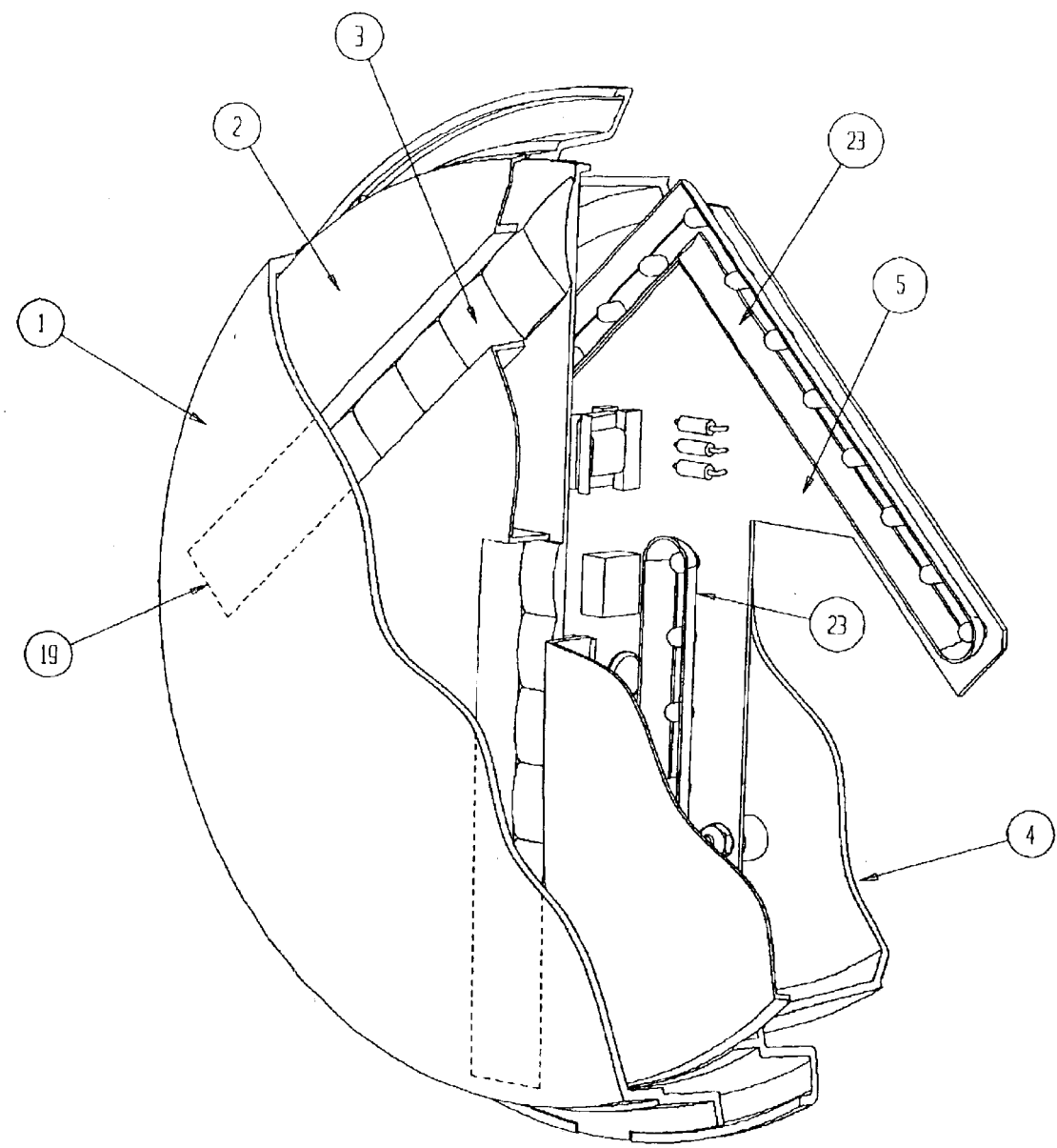
FIG. 9 is an isometric cut-away view of a thick mask embodiment of the invention using a reflector.
Figure 10:
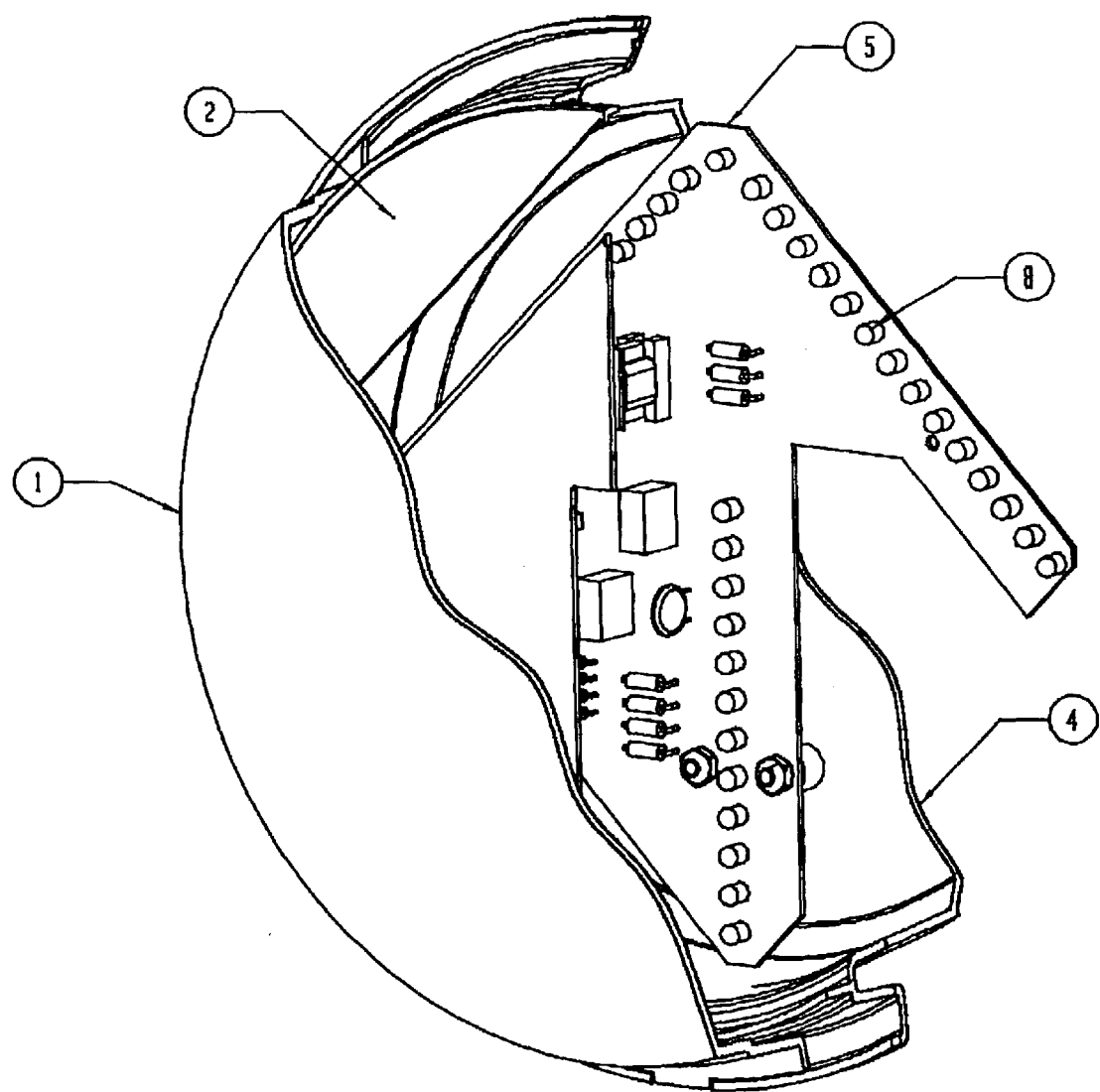
FIG. 10 is an isometric cut-away side view of an alternative embodiment of the invention.
Figure 11:
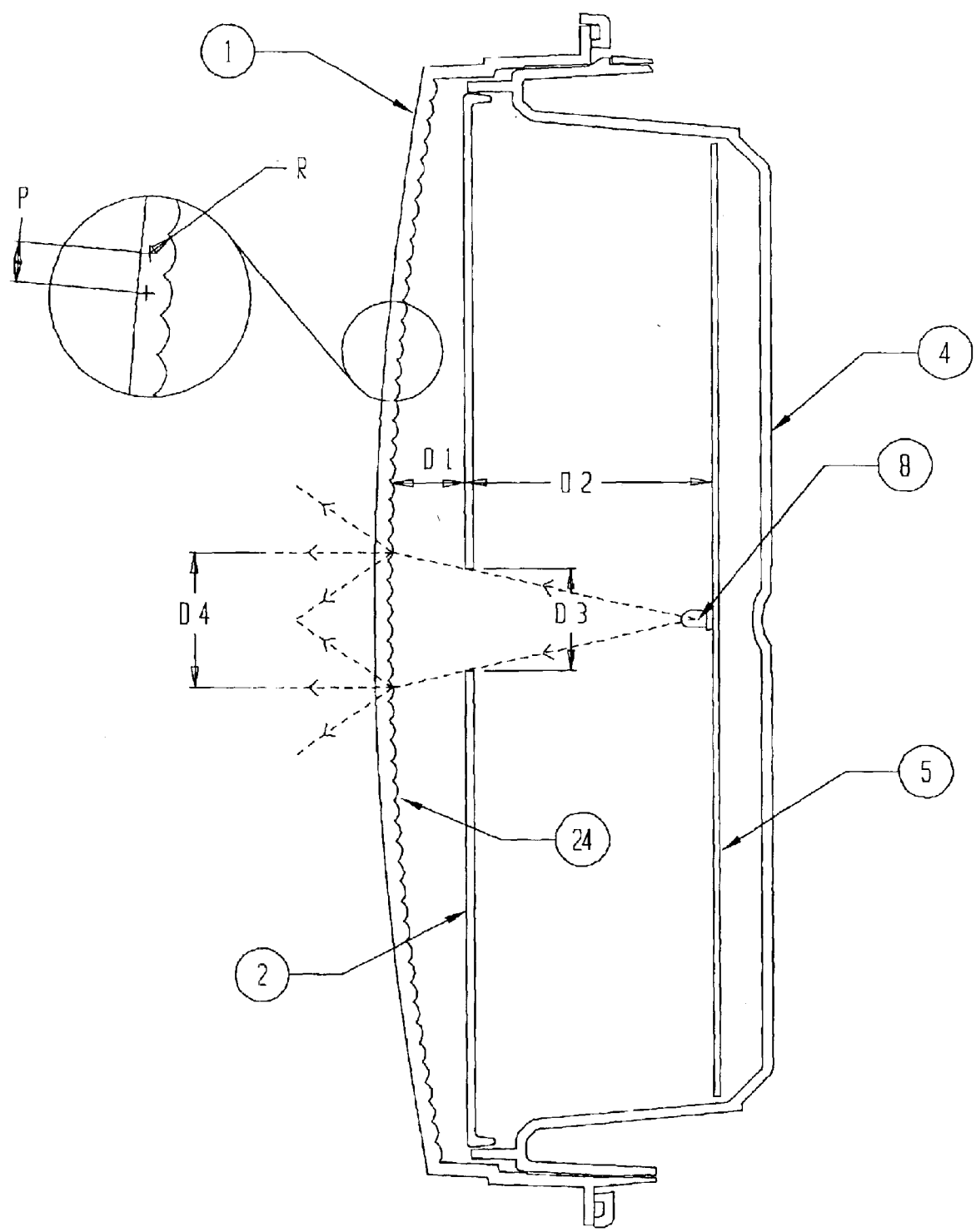
FIG. 11 is a side view of the embodiment shown in FIG. 10.

As shown in FIG. 9, reflectors 23 may be used to further decrease the number of LEDs 8 required to create a desired LED signal light output level. The reflector 23, lowers the amount of light emitted outside of the intended light emission pattern 20 by redirecting light normally escaping through the side of an LED 8. The reflector may also be configured to redirect light which reflects under total internal reflection conditions within the LED housing. A second reflection surface of the reflector may by aligned with the increased exit angle of the total internal reflection light component. Because the angle is higher than that of light escaping sideways from the LED housing, the second reflector surface appears as a step back in the first reflection surface and does not degrade the first surface's ability to redirect the sideways escaping light component. The extra materials cost of the reflector 23 is recouped by the lowered number of LEDs 8 required and the lower operating costs due to reduced energy consumption. The reflector(s) may be configured around individual LEDs or clusters of LEDs. A channel shaped reflector 23 allows a limited cross-over of the light emitted between nearby LEDs, lessening the change to the display aspect if one or more of the individual LEDs fails.

Figure 6A:
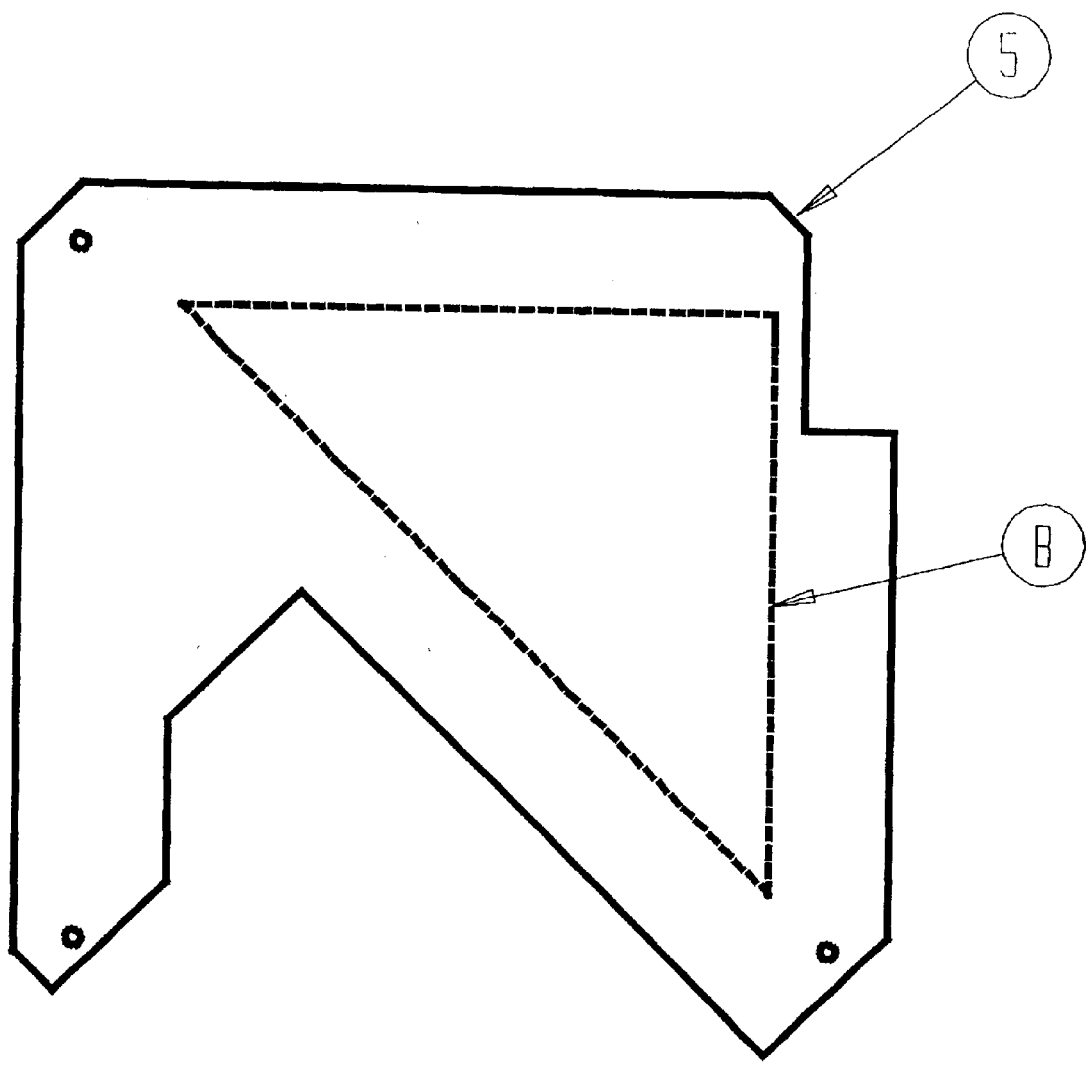
FIG. 6A is a schematic view of a PCB board for an arrow symbol signal.
Figure 6B:
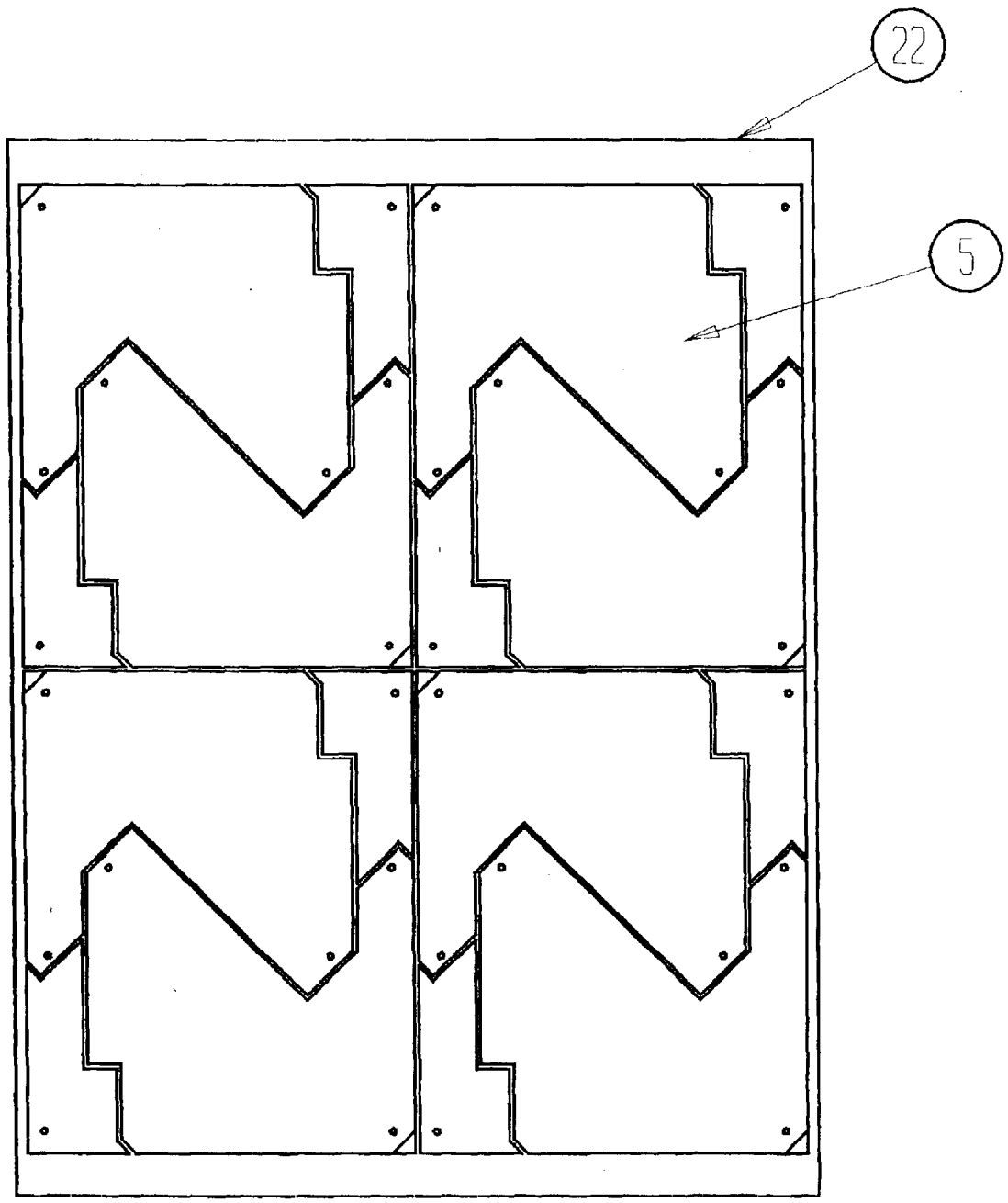
FIG. 6B is a schematic view of a bulk PCB showing the layout thereon of multiple PCB's according to FIG. 6A thereon.

The size of the PCB 5 may be determined by the smallest circle, rectangle or other shape that will encompass the desired LED pattern, thus saving material costs by minimizing the size of the PCB 5. Where arrow symbols are being displayed, the arrow form may be cut from a bulk PCB panel 22 cut out as shown in FIGS. 6A and 6B, minimizing the PCB material cost. Power supply and light degradation sensor circuitry may be located on the single PCB 5 in the area B.

Other embodiments of the present invention include but are not limited to pedestrian signals, pedestrian signals with countdown displays, informational signals including emergency exit signs, and any other form of LED symbol signal which would otherwise suffer from the "pixel effect". In the case of pedestrian signals or other large graphical symbols the cover may be omitted and or integrated with the mask, the diffusion surface located, for example on an inner surface of the optical elements 18 or on the signal's external surface.

This invention is entitled to a range of different embodiments and their equivalents, and is to be limited only by the scope of the following claims.

I claim:

1. A LED Symbol signal, comprising:
   at least one Led, mounted on
   a printed circuit board, arranged in
   a housing with an open end; the open end covered by
   a mask with at least one hole defining the symbol and a cover, with a plurality of optical elements substantially covering an inner face of the cover, wherein:
   said optical elements have a pitch, and
   a ratio of the pitch to a width of the symbol at the inner surface is less than 1:2.
2. The signal of claim 1, wherein the ratio is less than 1:4.
3. The signal of claim 1, wherein the ratio is less than 1:4.
4. A LED symbol signal, comprising:
   at least on LED, mounted on
   a printed circuit bard, arranged in
   a housing with an open end, the open end covered by
   a mask with at least one hole defining the symbol, and
   a cover having an inner face with a diffusion surface, the cover sealing the open end of the housing, wherein a light distribution pattern is symmetrical.

5. A LED symbol signal, comprising:
at least on LED, mounted on
a printed circuit bard, arranged in
a housing with an open end, the open end covered by
a mask with at least one hole defining the symbol, and a cover having an inner face with a diffusion surface, the cover sealing the open end of the housing, wherein a light distribution pattern is asymmetrical about either the horizontal or the vertical axis.

6. A LED symbol signal, comprising:
at least on LED, mounted on
a printed circuit bard, arranged in
a housing with an open end, the open end covered by
a mask with at least one hole defining the symbol, and a cover having an inner face with a diffusion surface, the cover sealing the open end of the housing, wherein:
said optical elements have a pitch and
a ratio of the pitch and a width of the symbol at the diffusion surface is less than 1:2.

7. The signal of claim 6, wherein the ratio is less than 1:4.

8. The signal of claim 6, wherein the ratio is approximately 1:10.

* * * * *

UNITED STATES PATENT AND TRADEMARK OFFICE
CERTIFICATE OF CORRECTION

PATENT NO. : 6,955,449 B2  Page 1 of 1
APPLICATION NO. : 10/388123
DATED : October 18, 2005
INVENTOR(S) : Patrick Martineau It is certified that error appears in the above-identified patent and that said Letters Patent is hereby corrected as shown below:

Col. 6, line 58,
Claim 3, change "4" to --10--
Col. 6, line 60,
Claim 4, change "on LED" to --one LED--
Col. 7, line 2,
Claim 5, change "on LED" to --one LED--
Col. 7, line 3,
Claim 5, change "bard" to --board--
Col. 7, line 12,
Claim 6, change "bard" to --board--

Signed and Sealed this

Ninth Day of January, 2007

JON W. DUDAS
*Director of the United States Patent and Trademark Office*